United States Patent
Lee et al.

(10) Patent No.: US 7,442,488 B2
(45) Date of Patent: Oct. 28, 2008

(54) POSITIVE TYPE PHOTOSENSITIVE PASTE COMPOSITION FOR PDP ELECTRODE, PDP ELECTRODE PREPARED THEREFROM, AND PDP COMPRISING THE PDP ELECTRODE

(76) Inventors: Beom-Wook Lee, c/o Samsung SDI Co., Ltd., 575 Shin-dong, Yeongtong-gu, Suwon-si, Gyeonggi-do (KR); Dong-Hee Han, c/o Samsung SDI Co., Ltd., 575 Shin-dong, Yeongtong, Suwon-si, Gyeonggi-do (KR); Sang-Wook Sin, c/o Samsung SDI Co., Ltd., 575 Shin-dong, Yeongtong-gu, Suwon-si, Gyeonggi-do (KR); Jin-Hwan Jeon, c/o Samsung SDI, Co., Ltd., 575 Shin-dong, Yeongtong-gu, Suwon-si, Gyeonggi-do (KR)

( * ) Notice: Subject to any disclaimer, the term of this patent is extended or adjusted under 35 U.S.C. 154(b) by 281 days.

(21) Appl. No.: 11/239,872

(22) Filed: Sep. 29, 2005

(65) Prior Publication Data

US 2006/0073412 A1    Apr. 6, 2006

(30) Foreign Application Priority Data

Oct. 6, 2004    (KR)    ............. 10-2004-0079487

(51) Int. Cl.
*G03F 7/00* (2006.01)
*G03F 7/004* (2006.01)

(52) U.S. Cl. .......... 430/270.1; 430/281.1; 430/905; 430/913

(58) Field of Classification Search .......... 430/270.1, 430/281.1, 905, 913
See application file for complete search history.

(56) References Cited

U.S. PATENT DOCUMENTS

| 5,972,564 A * | 10/1999 | Kawana et al. ........ 430/281.1 |
| 6,610,808 B2 * | 8/2003 | De et al. ........... 526/281 |
| 6,924,339 B2 * | 8/2005 | De et al. ........... 525/328.8 |

FOREIGN PATENT DOCUMENTS

JP    10-116558    5/1998

(Continued)

*Primary Examiner*—Amanda C. Walke
(74) *Attorney, Agent, or Firm*—Knobbe Martens Olson & Bear LLP

(57) ABSTRACT

There is provided a positive type photosensitive paste composition for a plasma display panel (PDP) electrode, including a conductive powder, an inorganic binder, and a photosensitive vehicle. The photosensitive vehicle includes an organic binder represented by formula (1), a photoacid generator, a solvent, and other additives:

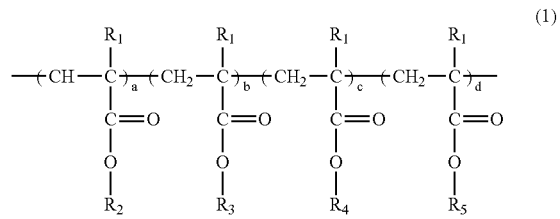

where $R_1$ is H or $CH_3$; $R_2$ is a saturated or unsaturated $C_1$-$C_6$ alkyl group or a $C_1$-$C_6$ group containing an ether group, a carbonyl group or an ester group; $R_3$ is a group having a hydroxyl group; $R_4$ is hydrogen or a group having a carboxylic group; and $R_5$ is a protecting group. Further embodiments provide a film prepared with such a paste; as well as a PDP electrode prepared with such a paste and a PDP having one or more such electrodes.

17 Claims, 3 Drawing Sheets

| | FOREIGN PATENT DOCUMENTS | | JP | 2004-110019 | 4/2004 |
|----|----|----|----|----|----|
| JP | 10-269848 | 10/1998 | | | |
| JP | 2000-195419 | 7/2000 | * cited by examiner | | |

1. APPLYING & PRINTING
2. DRYING
3. EXPOSING
4. THERMAL TREATING
5. DEVELOPING
6. BURING

POSITIVE TYPE PHOTOSENSITIVE PASTE COMPOSITION FOR PDP ELECTRODE, PDP ELECTRODE PREPARED THEREFROM, AND PDP COMPRISING THE PDP ELECTRODE

CROSS-REFERENCE TO RELATED PATENT APPLICATION

This application claims the benefit of Korean Patent Application No. 10-2004-0079487, filed on Oct. 6, 2004, in the Korean Intellectual Property Office, the disclosure of which is incorporated herein in its entirety by reference.

BACKGROUND OF THE INVENTION

1. Field of the Invention

The present invention relates to a positive type photosensitive paste composition for a plasma display panel (PDP) electrode, and more particularly, to a positive type photosensitive paste composition which hardly causes edge-curl and can obtain a high resolution micropattern.

2. Description of the Related Art

Figure 1:
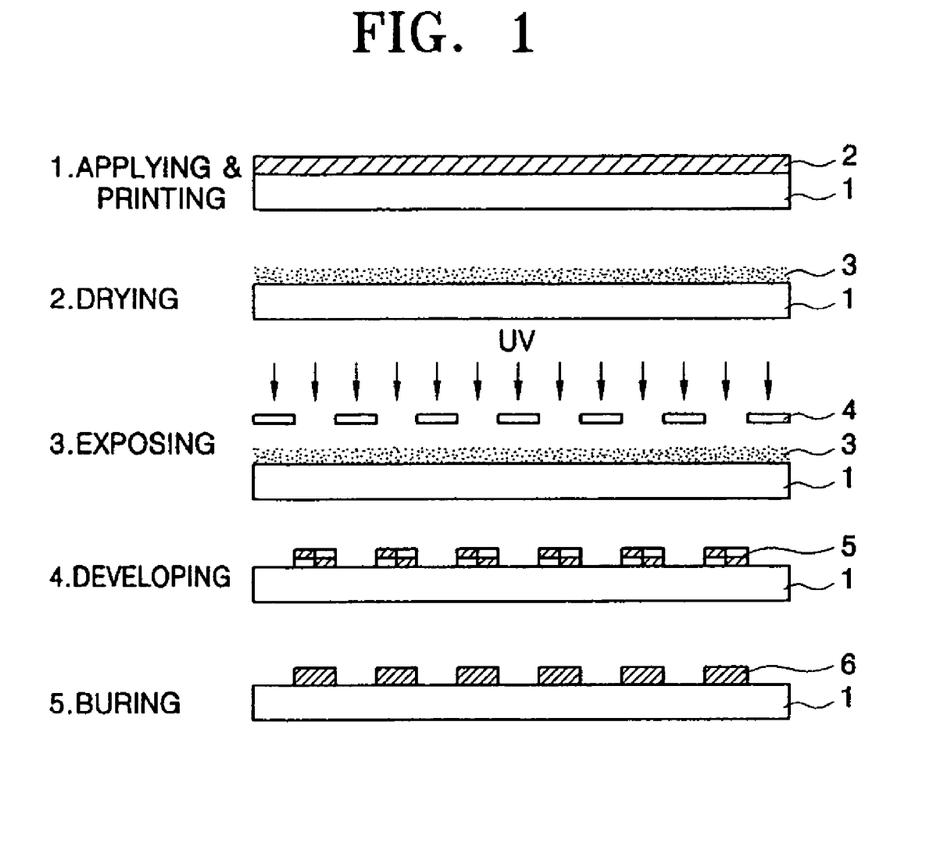
FIG. 1 illustrates a process of forming an electrode using a conventional photosensitive paste through photolithography.

Generally, a plasma display panel (PDP) electrode is formed using a photosensitive paste having a conductive component by photolithography. FIG. 1 illustrates a process of forming an electrode using a conventional photosensitive paste through photolithography. In the process, a photosensitive paste 2 is applied to a surface of a substrate 1 and printed, and then dried to form a dried film 3. The dried film 3 is exposed using a UV exposing apparatus equipped with a photomask 4. Then, an uncured portion which is blocked by the photomask 4 is developed and removed with a developing solution. The remained cured film 5 is heat-treated to obtain a predetermined temperature to form a patterned electrode 6.

Figure 2:
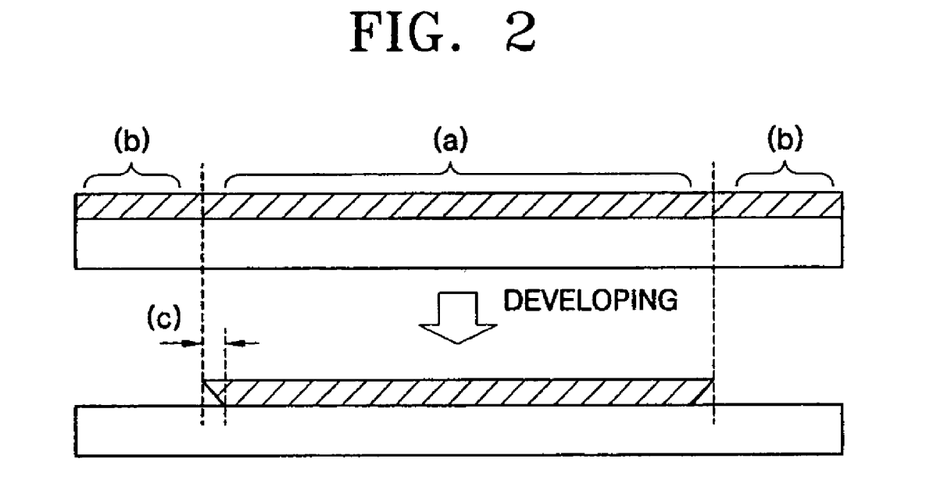
FIG. 2 is a cross-sectional view of a pattern of a conventional negative type photosensitive paste after being developed.

FIG. 2 illustrates a cross-section of a pattern after developing a conventional negative type photosensitive paste. Referring to FIG. 2, the patterned cured film has a cross-section of an inverted trapezoidal shape (so-called "under-cut"), in which a bottom portion is over-developed, after the developing process. An exposed region (a) and an unexposed region (b) are illustrated in FIG. 2. Since the dried paste film is almost composed of a conductive material which reflects and scatters light, a difference in the amount of light reaching the upper portion and the lower portion of the dried film is generated during exposing the (a) portion, thereby producing the under-cut. Thus, the under-cut is generated at exposed regions although the size of the under-cut is varied according to the type of paste. The formed under-cut acts as a primary factor in the occurrence of edge-curl (an edge portion of an electrode is curled) after heat-treating, the generation of residues (a portion around the heat-treated film is not clear), poor rectilinear path of a pattern, and poor resistance to sanding. These problems adversely affect important characteristics of the electrode, i.e., a withstand voltage, a resistance, resistance to sanding, etc. Thus, various methods for minimizing the under-cut have been proposed, but there is no method of preventing the occurrence of the under-cut.

SUMMARY OF THE INVENTION

The present invention provides a positive type photosensitive paste composition for a plasma display panel (PDP) electrode, which does not cause under-cut, a PDP electrode prepared therefrom, and a PDP using one or more PDP electrodes.

According to an aspect of the present invention, there is provided a positive type photosensitive paste composition for a PDP electrode, including a conductive powder, an inorganic binder and a photosensitive vehicle.

According to another aspect of the present invention, there is provided a PDP electrode prepared using the positive type photosensitive paste composition for a PDP electrode.

According to another aspect of the present invention, there is provided a PDP using one or more PDP electrodes.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present embodiments will now be described more fully with reference to the accompanying drawings, in which exemplary embodiments of the invention are shown.

Figure 3:
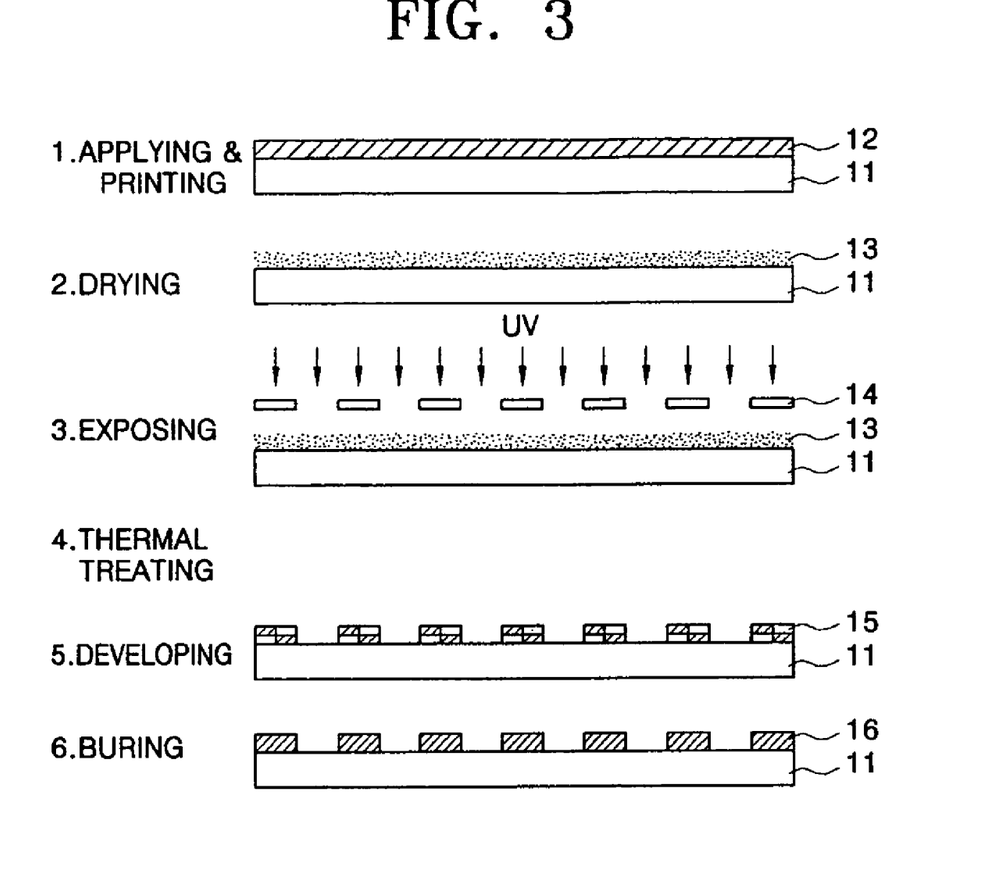
FIG. 3 illustrates a process for forming an electrode using a positive type photosensitive paste through photolithography according to the present invention.

FIG. 3 illustrates a process of forming an electrode using a positive type photosensitive paste through photolithography according to the present embodiments. Referring to FIG. 3, the process of forming an electrode using a positive type photosensitive paste further includes thermal treatment compared to a conventional process of forming an electrode. A photosensitive paste 12 is applied to a surface of a substrate 11 and printed, and then dried to form a dried film 13. The dried film 13 is exposed using a UV exposing apparatus equipped with a photomask 14, and then, thermal treatment is carried out. Due to the thermal treatment, a strong acidic component generated in an exposed region undergoes deprotection so that the exposed region is developed by an aqueous alkaline solution. The remained cured film 15 is heat-treated to obtain a predetermined temperature to form a patterned electrode 16.

Figure 4:
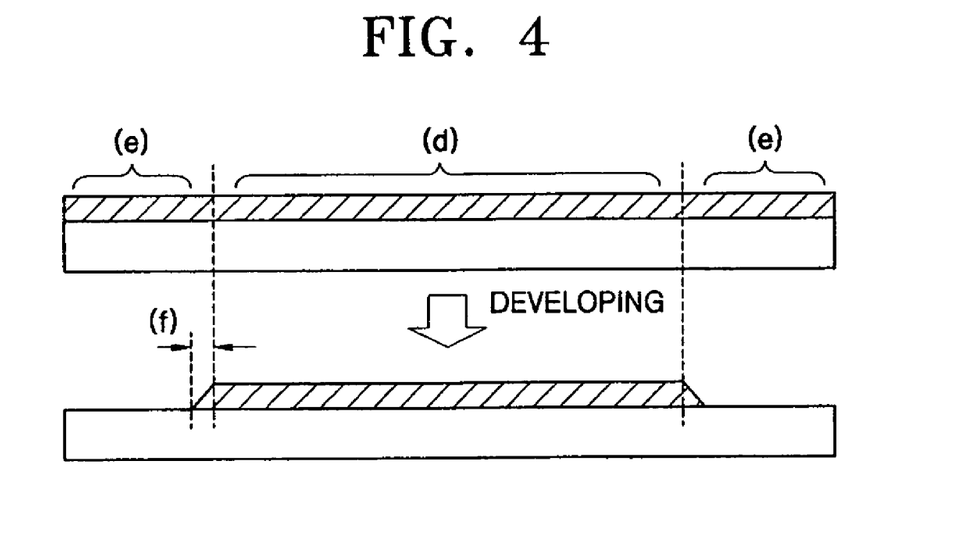
FIG. 4 is a cross-sectional view of a pattern of a positive type photosensitive paste after being developed according to the present invention.

The positive type photosensitive paste for a plasma display panel (PDP) electrode according to an embodiment of the present invention may form a pattern of a trapezoidal shape rather than an inverted trapezoidal shape as illustrated in FIG. 4, since a portion exposed to ultra violet rays, etc., is developed and removed. That is, the electrode has a trapezoidal shape in which the area of a lower portion which is in contact with a substrate is greater than that of an upper portion which is out of contact with the substrate.

The present invention provides a positive type photosensitive paste composition for a PDP electrode, including a conductive powder, an inorganic binder, and a photosensitive vehicle.

The photosensitive vehicle includes an organic binder, a photoacid generator, a solvent and other additives. The amount of the photosensitive vehicle is preferably from about 20 to about 100 parts by weight based on 100 parts by weight of the conductive powder. When the amount of the photosensitive vehicle is less than about 20 parts by weight, the printability of the paste is poor and an exposure sensitivity is reduced. When the amount of the photosensitive vehicle is greater than about 100 parts by weight, the amount of the conductive powder is relatively reduced, and thus, a linewidth of the conductive film is shrunk to an unacceptable degree and a short circuit results.

The organic binder can be a copolymer comprising recurring units of the formula (1):

wherein $R_1$ is H or $CH_3$; $R_2$ is a saturated or unsaturated $C_1$-$C_6$ alkyl group or a $C_1$-$C_6$ group containing an ether group, a carbonyl group or an ester group, preferably a saturated $C_1$-$C_6$ alkyl group; $R_3$ is a group having a hydroxyl group, preferably a $C_1$-$C_6$ hydroxyalkyl group; $R_4$ is a hydrogen or a group having a carboxylic group, preferably a $C_1$-$C_6$ carboxylalkyl group; $R_5$ is a carboxy protecting group; and each of a, b, c and d is a molar ratio (%) of each of monomers (A), (B), (C) and (D) represented by formula (2), a is 10 to 60, b is 0 to 30, c is 0 to 10, d is 10 to 60, and a+b+c+d=100. Examples of monomer A include methyl acrylate, ethyl acrylate, n-propyl acrylate, iso-propyl acrylate, n-butyl acrylate, iso-butyl acrylate, n-pentyl acrylate, n-hexyl acrylate, cyclohexyl acrylate etc., or a corresponding methacrylate of one of these compounds. Examples of monomer B include hydroxymethyl acrylate, 2-hydroxyethyl acrylate, 2-hydroxypropyl acrylate, 3-hydroxypropyl acrylate, 2-hydroxybutyl acrylate, 3-hydroxybutyl acrylate, 4-hydroxybutyl acrylate, 2-hydroxyethoxyethyl acrylate etc., or a corresponding methacrylate of one of these compounds. Examples of monomer C include acrylic acid, 1-carboxymethyl acrylate, 2-carboxyethyl acrylate, 3-carboxypropyl acrylate etc., or a corresponding methacrylate of one of these compounds. Examples of monomer D include t-butyl acrylate. tetrahydrofuranyl acrylate, 1-ethoxy-1-methylmethyl acrylate etc., or a corresponding methacrylate of one of these compounds. Suitable carboxy protecting groups are a t-butyl group, a tetrahydrofuranyl group or a 1-ethoxy-1-methylethyl group.

The copolymer represented by formula (1) may be formed by polymerizing monomers (A), (B), (C) and (D) represented by formula (2). The copolymer represented by formula (1) may be prepared by dissolving monomers represented by formula (2), and a radical polymerization initiator, such as 2,2-azobisisobutyronitrile, benzoyl peroxide, and t-butyl peroxide, in an organic solvent and heating the solution to a proper temperature to perform a radical polymerization.

The copolymer of formula (1) has a molecular weight of from about 5,000 to about 50,000 g/mol. When the molecular weight of the copolymer is less than 5,000 g/mol, the printability of the paste is poor. When the molecular weight of the copolymer is greater than about 50,000 g/mol, a non-exposed region is not completely removed upon development, and thus the rectilinear path after heat-treating is poor and undesirable residues are generated.

The copolymer represented by formula (1) can be used as the organic binder alone or in combination with at least one material selected from the group consisting of methylcellulose, ethylcellulose, nitrocellulose, hydroxymethylcellulose, hydroxyethylcellulose, hydroxypropylcellulose, carboxymethylcellulose, carboxyethylcellulose, and carboxyethylmethylcellulose to improve film levelling or thixotropy.

The photosensitive vehicle also includes at least one photoacid generator, at least one solvent and one or more other additives such as a sensitizer, a polymerization inhibitor, an antioxidant, a UV absorbent, an anti-foaming agent, a dispersant, a leveling agent or a plasticizer as described below.

The photoacid generator is a compound capable of generating strong acid according to a radiation method including radiation by ultra violet rays, X-rays and electron beam and examples thereof include diphenyliodonium hexafluorophosphate, diphenyliodonium hexafluoroarsenate, diphenyliodonium hexafluoroantimonate, diphenylparamethoxyphenyl triflate, diphenylparatoluethyl triflate, diphenylparaisobutylphenyl triflate, diphenylpara-t-butylphenyl triflate, triphenylsulfonium hexafluorophosphate, triphenylsulfonium hexafluoroarsenate, triphenylsulfonium hexafluoroantimonate, triphenylsulfonium triflate and dibutylnaphthylsulfonium triflate. The amount of the photoacid generator is preferably from about 0.1 to about 20 parts by weight based on 100 parts by weight of the organic binder. When the amount of the photoacid generator is less than about 0.1 part by weight, the exposed region is not properly developed. When the amount of the photoacid generator is greater than about 20 parts by weight, the exposure sensitivity is reduced since the photoacid generator absorbs the radiated rays.

The solvent may be one that can dissolve the organic binder and the initiator, is compatible with the crosslinking agent and other additives, and has a boiling point of about 150° C. or higher. When the boiling point is lower than about 150° C., the solvent is easily volatilized during preparing the composition, in particular, a 3-roll mill process, and printing state is poor due to rapid volatilization of the solvent upon printing. Examples of the solvent include, are not limited to, ethyl carbitol™ (diethylene glycol ethyl ether) (Dow Chemical Corporation, Midland, Mich.), butyl carbitol™, ethyl carbitol™ acetate, butyl carbitol™ acetate, Texanol™ (2,2,4-trimethyl-1,3-pentanediol monoisobutyrate propionic acid, 2-methyl-, monoester with 2,2,4-trimethyl-1,3-pentanediol isobutyric acid ester with 2,2,4-trimethyl-1,3-pentanediol) (Eastman Chemical Co., Kingsport, Tenn., U.S.A), terpine oil, dipropyleneglycol methyl ether, dipropyleneglycol ethyl ether, dipropyleneglycol monomethylether acetate, γ-butyrolactone, cellosolve™ (2-ethoxyethanol) (Dow Chemical, Midland, Mich.) acetate, butyl cellosolve™ acetate, and tripropyleneglycol. The amount of the solvent is preferably from about 100 to about 500 parts by weight based on 100 parts by weight of the organic binder. When the amount of the solvent is less than about 100 parts by weight, the viscosity of the paste is too high, and thus the printing process is not easily performed. When the amount of the solvent is greater than about 500 parts by weight, the viscosity of the paste is too low, and thus the printing process cannot be performed.

The photosensitive vehicle may further include a sensitizer for improving sensitivity, a polymerisation inhibitor and an antioxidant for stably storing the composition, a UV absorbent for improving resolution, an antifoaming agent for reducing foams in the composition, a dispersant for improving dispersion, a levelling agent for improving evenness of the film upon printing, and a plasticizer for providing thixotropy, and the like.

The positive type photosensitive paste composition for a PDP electrode of the present embodiment includes a conductive powder and an inorganic binder.

The conductive powder is sintered upon heat-treating to provide the heat-treated film with conductivity. The conductive powder is at least one metal selected from the group consisting of Ag, Au, Cu, Pt, Pd, Al, Ni, or an alloy thereof, and a powder of Cu, Ni, Al, W and Mo coated with Ag or Au. The conductive powder has preferably a spherical shape because spherical particles have better filling ratio and UV permeability than plate-shaped or amorphous particles. The conductive particles have an average particle diameter ranging from 0.1 to 10.0 µm. When the average particle diameter is greater than 10.0 µm, the rectilinear path of a heat-treated film pattern is poor and a resistance of the heat-treated film increases. When the average particle diameter is less than 0.1 µm, dispersion and exposure sensitivity of the paste are poor.

The amount of the conductive powder is preferably from about 50 to about 80 parts by weight based on 100 parts by weight of the positive type photosensitive paste composition, the amount of the inorganic binder is from about 0.1 to about 10.0 parts by weight based on 100 parts by weight of the conductive powder, and the amount of the photosensitive vehicle is from about 20 to about 100 parts by weight based on 100 parts by weight of the conductive powder.

When the amount of the conductive powder is greater than about 80 parts by weight, a pattern having a desired linewidth cannot be obtained due to poor printability and a decrease in exposure sensitivity. When the amount of the conductive powder is less than about 50 parts by weight, the linewidth of the conductive film is shrunk to an unacceptable degree upon heat-treating and a short circuit may occur.

The positive type photosensitive paste composition for a PDP electrode of the present embodiment may further include nanoparticles having a very small average particle diameter. When a small amount of nanoparticles is added, the amount of organic solids may be reduced, and thus exposure sensitivity is improved due to a thin dried film, uniform linewidth and thickness of the electrode is obtained due to a low shrinkage rate upon heat-treating, and a withstand voltage property is improved due to minimized edge-curl phenomenon.

The nanoparticles may be composed of conductive metals Ag, Au, Cu, Pt, Pd, Al, Ni, W, Mo, or an alloy thereof, or non-conductive silica, alumina or glass used as an inorganic binder. The nanoparticles may be composed of the same metals as the rest of the conductive powder or be made of different material. Spherical nanoparticles are preferable in terms of specific surface area or UV permeation. The nanoparticles have an average particle diameter of from about 1 to about 100 nm. When the average particle diameter is greater than about 100 nm, an effect of increasing a viscosity of the paste is negligible. When the average particle diameter is less than 1 nm, dispersion and viscosity of the paste rapidly increase, and thus it is difficult to control viscosity of the paste. The amount of nanoparticles in the paste is from about 0.1 to about 10.0 parts by weight based on 100 parts by weight of the conductive powder. When the amount of nanoparticles is less than about 0.1 part by weight, an effect of increasing a viscosity of the paste is negligible. When the amount of nanoparticles is greater than about 10.0 parts by weight, printability is poor due to a high viscosity and the exposure sensitivity is reduced.

The inorganic binder in the photosensitive paste composition improves a sintering property of the conductive powder and allows the conductive powder to adhere to a glass substrate. Examples of such an inorganic binder include, but are not limited to, composite oxides of Pb, Si, B, Al, Zn, Na, K, Mg, Ba and Bi. Specifically, binders based on $PbO-SiO_2$, $PbO-SiO_2-B_2O_3$, $PbO-SiO_2-B_2O_3-ZnO$, $PbO-SiO_2-B_2O_3-BaO$, $PbO-SiO_2-ZnO-BaO$, $ZnO-SiO_2$, $ZnO-B_2O_3-SiO_2$, $ZnO-K_2O-B_2O_3-SiO_2-BaO$, $Bi_2O_3-SiO_2$, $Bi_2O_3-B_2O_3-SiO_2$, $Bi_2O_3-B_2O_3-SiO_2-BaO$ and $Bi_2O_3-B_2O_3-SiO_2-BaO-ZnO$ systems may be used. The appearance of the inorganic binder particle is not particularly restricted, but may be spherical and an average particle diameter thereof is preferably from about 0.1 to about 10 µm. When the average particle diameter is less than about 0.1 µm, the exposure sensitivity is reduced. When the average particle diameter is greater than about 10 µm, the heat-treated film is uneven and rectilinear path of the electrode is poor.

The inorganic binder has a softening temperature ranging from about 400 to about 600° C. When the softening temperature is lower than about 400° C., the inorganic binder streams down and diffuses around the electrode and the organic materials are not easily decomposed. When the softening temperature is higher than about 600° C., the inorganic binder cannot be softened since the glass substrate bends at a temperature higher than 600° C., and thus the heat-treating temperature cannot be higher than about 600° C. The amount of the inorganic binder is preferably from about 0.10 to about 10.0 parts by weight based on 100 parts by weight of the conductive powder. When the amount of the inorganic binder is less than about 0.10 part by weight, the conductive powder is not easily sintered and the adhesion of the conductive film to the glass substrate is reduced. When the amount of the inorganic binder is greater than about 10.0 parts by weight, the resistance of the electrode increases.

The present invention provides a plasma display panel electrode having a cross-section of a trapezoidal shape, in which the area of a lower portion which is in contact with the substrate is greater than that of a upper portion which is out of contact with the substrate, prepared using the positive type photosensitive paste composition.

FIG. 4 is a cross-sectional view of a pattern obtained after developing the positive type photosensitive paste composition of the present embodiments. A non-exposed region (d), an exposed region (e), and the size (f) of an over-cut are illustrated in FIG. 4. The positive type photosensitive paste produces an over-cut. A tilt angle at both ends in the trapezoid may be varied according to the developing reaction conditions. Although the over-cut is naturally produced, the size (f) of the over-cut is associated with an electrode shape and does not influence on electrode characteristics. Thus, it is not necessary to try to reduce the over-cut.

Figure 5:
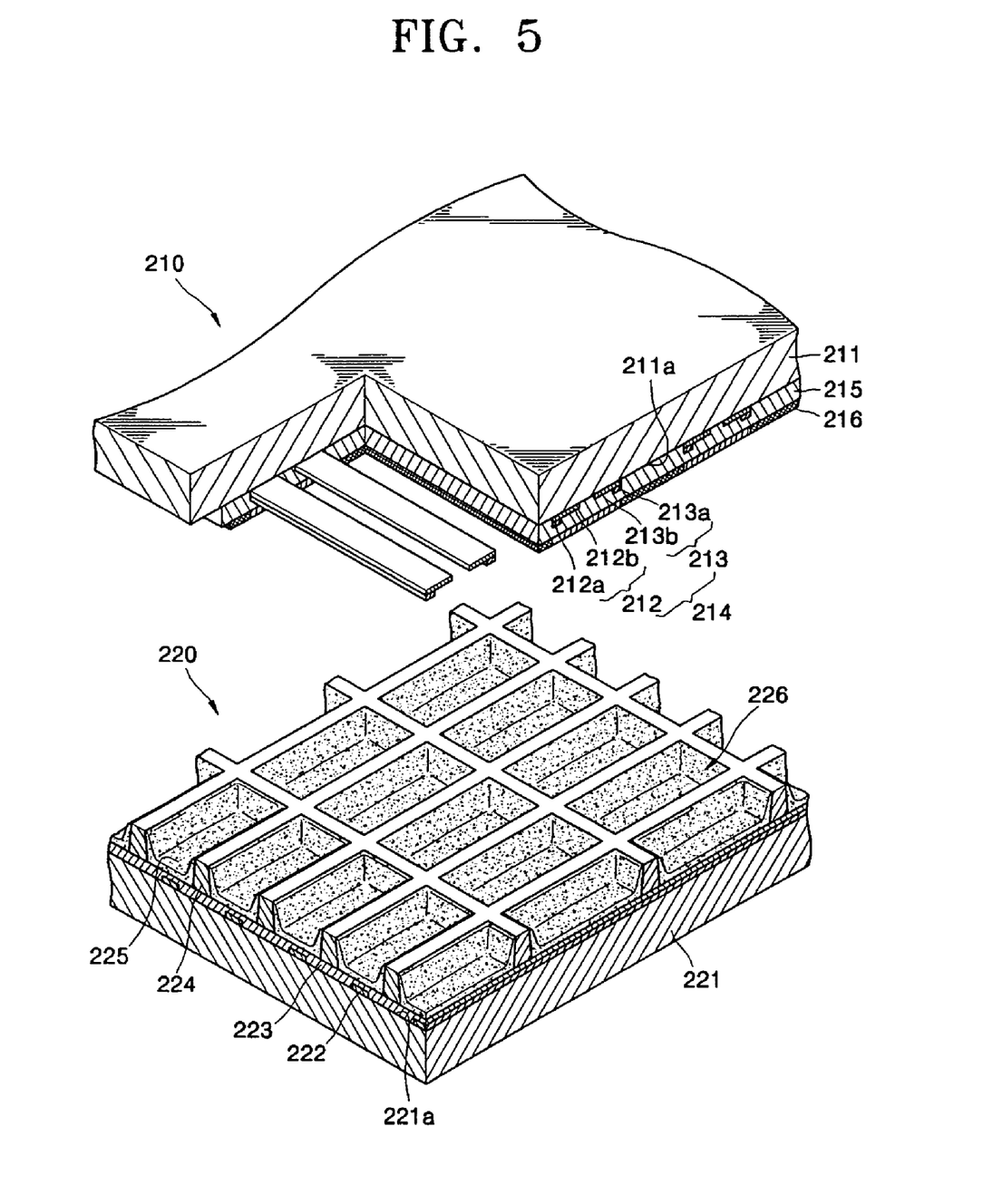
FIG. 5 is a partially exploded perspective view of a plasma display panel (PDP) including a PDP electrode prepared according to the present invention.

FIG. 5 illustrates a specific structure of a PDP including one or more PDP electrode according to the present embodiments. The paste composition according to the present embodiments can be directly used to prepare an electrode and can also be used in the form of a film. The prepared PDP electrode can be used for the preparation of white electrodes and address electrodes of bus electrodes.

The PDP prepared according to the present embodiments includes a front panel 210 and a rear panel 220. The front panel 210 includes a front substrate 211, sustain electrode pairs 214 having Y electrodes 212 and X electrodes 213 formed on a rear surface 211a of the front substrate 211, a front dielectric layer 215 covering the sustain electrode pairs 214, and a protecting layer 216 covering the front dielectric layer. Each of Y electrodes 212 and X electrodes 213 has transparent electrodes 212b and 213b composed of ITO and the like; and bus electrodes 212a and 213a including a black electrode (not shown) for improving darkness and a white electrode (not shown) for providing conductivity. The bus electrodes 212a and 213a are connected to connection cables 31 disposed at left and right sides of the PDP.

The rear panel 220 includes a rear substrate 221, address electrodes 222 formed on a front surface 221a of the rear substrate so as to cross the sustain electrode pairs, a rear dielectric layer 223 covering the address electrodes, a barrier rib 224 formed on the rear dielectric layer to divide light emitting cells 226, and a phosphor layer 225 disposed in the light emitting cell 226. The address electrodes 222 are connected to connection cables disposed at upper and lower sides of the PDP.

The present embodiments will now be described in greater detail with reference to the following examples. The following examples are for illustrative purposes only and are not intended to limit the scope of the embodiments.

EXAMPLES

Example 1

Synthesis of Polymer

A polymer was synthesized using monomers represented by formula (2) through radical polymerization. In the polymerization, 2,2'-azobisisobutyronitrile (AIBN) was used as an initiator and ethyl carbitol™ acetate (ECA) or Texanol™ was used as a solvent. A weight ratio of monomers to the solvent was 40:60.

Synthesis of Polymer (1)

Ethyl carbitol™ acetate as a solvent; methyl methacrylate, hydroxyethyl methacrylate, methacrylic acid, and t-butyl methacrylate as monomers; and AIBN as an initiator were added to a reaction vessel, and then mixed by stirring. Nitrogen gas was injected into the reaction vessel under stirring and the temperature of the reaction vessel was raised to 60° C. to initiate polymerization. The viscosity of the polymer was checked periodically. If the viscosity of the polymer was greater than 20,000 cps (at 60° C.), oxygen gas instead of nitrogen gas was injected into the reaction vessel to stop polymerization. The reaction vessel was cooled to room temperature to complete polymerization. The viscosity of the synthesized polymer was measured using a viscometer.

Thereafter, polymers were synthesized in the same manner as the synthesis of polymer (1), except that solvents and monomers indicated in Table 1 were used. The viscosity of each polymer was measured and the results are indicated in Table 1.

TABLE 1

| Polymer No. | Molar ratio (%) of monomers | Solvent | Viscosity (at 60° C.) |
| --- | --- | --- | --- |
| 1 | a:b:c:d = 40:10:5:45 | ECA | 24,500 |
| 2 | e:b:c:d = 30:15:5:45 | ECA | 26,000 |
| 3 | e:b:-:d = 40:20:-:40 | ECA | 22,500 |
| 4 | e:-:-:d = 50:-:-:50 | Texanol™ | 28,400 |
| 5 | a:b:f:d = 40:10:5:45 | Texanol™ | 27,200 |
| 6 | e:g:f:d = 30:15:5:45 | Texanol™ | 30,100 |

(a = methyl methacrylate, b = 2-hydroxyethyl methacrylate, c = methacrylic acid, d = t-butyl methacrylate, e = n-butyl methacrylate, f = acrylic acid, g = 2-hydroxyethyl acrylate.)

Example 2

Preparation of Paste

Pastes were prepared using compositions indicated in Table 2 as follows:

i) A polymer, a photoacid generator, a solvent and additives were placed in a mixer and dissolved to prepare a vehicle;

ii) An inorganic binder and conductive particles were placed in a planetary mixer (PLM), and then the vehicle was slowly added thereto while stirring to give a combined paste;

iii) The combined paste was mechanically mixed using a 3-roll mill;

iv) Impurities such as large particles and dust were removed by filtering;

v) Bubbles in the paste were removed using a bubble remover.

TABLE 2

|  | Paste (1) | Paste (2) | Paste (3) | Paste (4) | Paste (5) | Paste (6) |
| --- | --- | --- | --- | --- | --- | --- |
| Conductive powder | 67 | 66.5 | 67 | 67 | 37 | 67 |
| Nanoparticles | — | 0.5 | — | — | — | — |
| Metal-coated Cu powder | — | — | — | — | 30 | — |
| Glass frit | 3 | 3 | 3 | 3 | 3 | 3 |
| Binder | 15 (polymer (1)) | 12 (polymer (2)) | 13 (polymer (3)) + 0.5 (HPC) | 12 (polymer (4)) + 1.0 (HPC) | 15 (polymer (5)) | 15 (polymer (6)) |
| Photoacid generator | 1 | 1 | 1 | 1 | 1 | 1 |
| Additive | 0.5 | 0.5 | 0.5 | 0.5 | 0.5 | 0.5 |

TABLE 2-continued

|  | Paste (1) | Paste (2) | Paste (3) | Paste (4) | Paste (5) | Paste (6) |
|---|---|---|---|---|---|---|
| Solvent (1) | 13.5 | 16.5 | — | — | — | — |
| Solvent (2) | — | — | 15.0 | 15.5 | 13.5 | 13.5 |

(In the above Table 2, the units are expressed as % by weight)

In Table 2, polymers were those synthesized in Example 1 (containing the solvent), the paste (2) included the conductive powder containing nanoparticles, pastes (3) and (4) included a mixture of the polymer and hydroxypropyl cellulose (HPC) as a binder, and the paste (5) included the conductive powder containing a metal-coated Cu powder. The descriptions for components of Table 2 are provided in Table 3.

TABLE 3

| Component | Content |
|---|---|
| Conductive powder | Ag powder, spherical, surface area: 0.80 $m^2/g$, average particle size: 1.4 μm |
| Nanoparticles | Ag powder, spherical, average particle size: 20 nm |
| Metal-coated Cu powder | Ag-coated Cu powder, spherical, specific surface area: 0.38 $m^2/g$, average particle size: 2.5 μm |
| Inorganic binder | PbO—$SiO_2$—$B_2O_3$-based, amorphous, average particle size: 1.5 μm, maximum size: 3.4 μm |
| Photoacid generator | Triphenylsulfonium triflate |
| Additive | Dispersant (non-silicon type) + storage stabilizer + thickener |
| Solvent | Solvent(1): ECA, solvent(2): Texanol ™ |

Example 3

Preparation of Film

The pastes prepared in Example 2 can be directly used to prepare an electrode, and can also be used as a film prepared as follows:
i) The paste is printed on a substrate film using a screen printing method;
ii) The printed substrate film is dried in a dryer to form a photosensitive layer;
iii) A protecting film is laminated on the dried paste.

Film (1)

The paste (1) was printed on a 40 μm thick PET film using a SUS #325 screen, and then dried in an IR drying system at 85° C. for 15 minutes to form a photosensitive layer. A 30 μm thick PE film was laminated on the dried photosensitive layer to form a protecting film, thereby preparing a dry film.

Films (2) to (6)

Films (2) to (6) were prepared using pastes (2) to (6) in the same manner as the preparation of film (1).

Example 4

Evaluation (1) of Paste

The positive type photosensitive pastes prepared in Example 2 were evaluated through the following process. For the comparison, a conventional paste was also evaluated.

(1) The paste was printed on a glass substrate using a screen printing method.
(2) The printed glass substrate was dried in an IR drying system at 100° C. for 15 minutes.
(3) UV light of 500 $mJ/cm^2$ was radiated using a UV exposing device equipped with a high pressure mercury lamp.
(4) A thermal treatment was performed using the IR drying system at 120° C. for 5 minutes (this step was not performed on the comparative paste).
(5) Developing was performed by spraying a 0.4% aqueous $NaCO_3$ solution at 30° C. at a nozzle pressure of 1.5 $kgf/cm^2$.
(6) Heat treatment was performed using an electric furnace at 580° C. for 15 minutes.
(7) The thickness of the heat-treated film was measured using film thickness measuring equipment.
(8) Edge-curl was evaluated by observing the cross section of the heat-treated film using a scanning electron microscope (SEM).
(9) A dielectric substance was printed, dried and burned on the heat-treated film to form a dielectric film.
(10) Withstand voltage was measured using a withstand voltage meter.
(11) The resistance to sanding of the electrode was evaluated using a sanding device.

The results obtained by the above testing process are set forth below in Table 4.

TABLE 4

|  | Paste (1) | Paste (2) | Paste (3) | Paste (4) | Paste (5) | Paste (6) | Paste (7) |
|---|---|---|---|---|---|---|---|
| Thickness of heat-treated film (μm) | 4.2 | 4.1 | 4.0 | 4.1 | 4.3 | 4.2 | 4.5 |
| Height of edge | 4.5 | 4.2 | 4.3 | 4.3 | 4.5 | 4.4 | 7.8 |
| Edge-curl (%) | 7.1 | 2.4 | 7.5 | 4.9 | 4.7 | 4.8 | 73.3 |
| Specific resistance (μΩ · cm) | 2.1 | 1.9 | 2.0 | 2.2 | 2.1 | 2.0 | 2.5 |
| Withstand voltage (V) | 710 | 750 | 700 | 720 | 730 | 720 | 620 |
| Resistance to sanding | 3 or more | 3 or more | 3 or more | 3 or more | 3 or more | 3 or more | 2 |

In the above Table 4: Edge-curl (%): ((height of edge-thickness of heat-treated film)/thickness of heat-treated film) × 100

Resistance to Sanding

A degree of damage of an electrode edge was evaluated with respect to the number of sanding, in which 3 or more indicated that the electrode edge was not damaged even after sanding three times.

It can be seen from the results of Table 4 that the comparative paste resulted in a film that possessed an unacceptably high amount of edge-curl, thereby resulting in poor specific resistance and withstand voltage properties, whereas the positive type photosensitive pastes (1) to (6) possessed an insignificant amount of edge-curl, thereby resulting in good specific resistance and withstand voltage properties.

Example 5

Evaluation (2) of Paste

The resolution of the positive type photosensitive paste (3) from Example 2 and that of the comparative paste were compared and evaluated as follows:

(1) The paste was printed on a glass substrate using a screen printing method;
(2) The printed glass substrate was dried in an IR drying system at 100° C. for 15 minutes;
(3) Light of 500 mJ/cm² was radiated using a high pressure mercury lamp equipped with photomasks having a line/space (L/S) distance of 10, 30, 50, and 100 μm;
(4) A thermal treatment was performed using the IR drying system at 120° C. for 5 minutes (this step was not performed on the comparative paste);
(5) Developing was performed by spraying a 0.4% aqueous NaCO₃ solution at 30° C. with a nozzle pressure of 1.5 kgf/cm²;
(6) The patterned film was evaluated using an optical microscope;

The results obtained from this testing procedure are set forth below in Table 5.

TABLE 5

| L/S (μm) | 10 | 30 | 50 | 100 |
|---|---|---|---|---|
| Paste (3) | Partially developed | Good | Good | Good |
| Comparative paste | — | Poor | Partially developed | Good |

As is apparent from the results of Table 5, the positive type photosensitive paste (3) resulted in films that had good resolution. Thus, it can be understood that a positive type photoresist is used in the production of a semiconductor DRAM in order to improve the resolution of the photoresist.

Example 6

Evaluation of Film

The films prepared in Example 3 were evaluated using the following process:

(1) The photosensitive layer was laminated on a substrate at a rate of 1.0 m/min, the temperature of 100° C., and a heating roller pressure of 50 psi while peeling off the protecting film using a laminator;
(2) The laminated substrate was allowed to cool to room temperature over a period of about 15 minutes;
(3) UV light of 500 mJ/cm² was applied to the laminated substrate using a photomask having a circuit pattern formed thereon and a UV exposing device;
(4) A thermal treatment was performed using the IR drying system at 120° C. for 5 minutes;
(5) Developing was performed by spraying a 0.4% aqueous NaCO₃ solution at 40° C. with a nozzle pressure of 1.2 kgf/cm² for 20 seconds to remove a non-exposed region;
(6) The patterned photosensitive layer was heat-treated at 580° C. for 15 minutes;
(7) The thickness of the heat-treated film was measured using film thickness measuring equipment;
(8) Edge-curl was evaluated by observing the cross section of the heat-treated film using a scanning electron microscope (SEM);
(9) A dielectric substance was printed, dried and heat-treated on the heat-treated film to form a dielectric film;
(10) Withstand voltage was measured using a withstand voltage meter;
(11) The resistance to sanding of the electrode was evaluated using a sanding device;

The results obtained from this testing process are set forth below in Table 6.

TABLE 6

| | Film (1) | Film (2) | Film (3) | Film (4) | Film (5) | Film (6) |
|---|---|---|---|---|---|---|
| Thickness of heat-treated film (μm) | 4.1 | 4.0 | 4.0 | 4.0 | 4.1 | 4.1 |
| Height of Edge | 4.4 | 4.0 | 4.3 | 4.3 | 4.4 | 4.4 |
| Edge-curl* | 7.3 | 5.0 | 7.5 | 7.5 | 7.3 | 7.3 |
| Specific resistance (μΩ·cm) | 2.2 | 2.0 | 2.1 | 2.3 | 2.1 | 2.3 |
| Withstand voltage (V) | 710 | 740 | 710 | 700 | 720 | 710 |
| Resistance to sanding | 3 or more | 3 or more | 3 or more | 3 or more | 3 or more | 3 or more |

(In the above Table 6: Edge-curl (%): ((height of edge-thickness of heat-treated film)/thickness of heat-treated film) × 100)

The results of Table 6 with the results of Table 4, demonstrate that when a film prepared using the positive type photosensitive paste is used in turn to form an electrode the favorable characteristics imparted to the silver by the positive type photosensitive paste are maintained when an electrode is formed from such a film.

The present embodiments relate to a positive type photosensitive paste for forming an electrode pattern on a substrate in the preparation of a plasma display panel (PDP). When using the positive type photosensitive paste, the under-cut is not produced after developing, and thus problems of edge-curl, residues, and poor rectilinear path of a pattern which are produced when using a conventional negative-type photosensitive paste can be reduced or eliminated, thereby improving the resistance to sanding, the withstand voltage, the resistance, and other significant properties of an electrode.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A positive type photosensitive paste composition for a plasma display panel (PDP) electrode having a trapezoidal shape in which an area of a lower portion which is in contact with a substrate is greater than that of an upper portion which is out of contact with a substrate, comprising:
a conductive powder, an inorganic binder and a photosensitive vehicle, wherein the photosensitive vehicle comprises an organic binder, a photoacid generator, a solvent and one or more additives, wherein the organic binder comprises a copolymer comprising recurrent units of the formula (1):

wherein $R_1$ is H or $CH_3$, $R_2$ is a saturated or unsaturated $C_1$-$C_6$ alkyl group or a $C_1$-$C_6$ group containing an ether group, a carbonyl group or an ester group, $R_3$ is a group having a hydroxyl group, $R_4$ is hydrogen or a group having a carboxylic group, preferably a $C_1$-$C_6$ carboxylalkyl group, $R_5$ is carboxy protecting group, and each of a, b, c and d is a molar ratio (%) of each monomer, a is 10 to 60, b is 0 to 30, c is 0 to 10, d is 10 to 60, and a+b+c+d=100;

wherein the photoacid generator is at least one selected from the group consisting of diphenyliodonium hexafluorophosphate, diphenyliodonium hexafluoroarsenate, diphenyliodonium hexafluoroantimonate, diphenylparamethoxyphenyl triflate, diphenylparatoluethyl triflate, diphenylparaisobutylphenyl triflate, diphenylpara-t-butylphenyl triflate, triphenylsulfonium hexafluorophosphate, triphenylsulfonium hexafluoroarsenate, triphenylsulfonium hexafluoroantimonate, triphenylsulfonium triflate and dibutylnaphthylsulfonium triflate; and wherein an amount of the photoacid generator is from about 0.1 to about 20 parts by weight based on 100 parts by weight of the organic binder.

2. The positive type photosensitive paste composition for a PDP electrode of claim 1, wherein in formula (1), $R_2$ is a substituted or unsubstituted $C_1$-$C_6$ alkyl group, $R_3$ is a $C_1$-$C_6$ hydroxyalkyl group, $R_4$ is a $C_1$-$C_6$ carboxyalkyl group, and $R_5$ is a t-butyl group, tetrahydrofuranyl group or 1-ethoxy-1-methylethyl group.

3. The positive type photosensitive paste composition for a PDP electrode of claim 1, wherein an amount of the photosensitive vehicle is from about 20 to about 100 parts by weight based on 100 parts by weight of the conductive powder.

4. The positive type photosensitive paste composition for a PDP electrode of claim 1, wherein the solvent is at least one selected from the group consisting of ethyl diethylene glycol ethyl ether, butyl diethylene glycol ethyl ether, ethyl diethylene glycol ethyl ether acetate, butyl diethylene glycol ethyl ether acetate, a combination of 2,2,4-trimethyl-1,3-pentanediol monoisobutyrate propionic acid, 2-methyl-, monoester with 2,2,4-trimethyl-1,3-pentanediol Isobutyric acid ester with 2,2,4-trimethyl-1,3-pentanediol, terpine oil, dipropyleneglycol methylether, dipropyleneglycol ethylether, dipropyleneglycol monomethylether acetate, γ-butyrolactone, 2-ethoxyethanol acetate, butyl 2-ethoxyethanol acetate, and tripropyleneglycol.

5. The positive type photosensitive paste composition for a PDP electrode of claim 1, wherein the photosensitive vehicle further comprises at least one additive selected from the group consisting of a sensitizer, a polymerization inhibitor, an antioxidant, a UV absorbent, an antifoaming agent, a dispersant, a levelling agent, and a plasticizer.

6. The positive type photosensitive paste composition for a PDP electrode of claim 1, wherein the conductive powder is at least one selected from the group consisting of Ag, Au, Cu, Pt, Pd, Al, Ni, or an alloy thereof, and a powder of Cu, Ni, Al, W and Mo coated with Ag or Au.

7. The positive type photosensitive paste composition for a PDP electrode of claim 1, wherein an average particle diameter of the conductive powder is from about 0.1 to about 10.0 μm.

8. The positive type photosensitive paste composition for a PDP electrode of claim 1, further comprising nanoparticles with an average particle diameter of from about 1 to about 100 nm.

9. The positive type photosensitive paste composition for a PDP electrode of claim 8, wherein the nanoparticles comprises at least one selected from the group consisting of conductive metal Ag, Au, Cu, Pt, Pd, Al, Ni, W, Mo, or an alloy thereof, and further wherein non-conductive silica, alumina, or glass is used as an inorganic binder.

10. The positive type photosensitive paste composition for a PDP electrode of claim 1, wherein the inorganic binder is a composite oxide of Pb, Si, B, Al, Zn, Na, K, Mg, Ba or Bi.

11. The positive type photosensitive paste composition for a PDP electrode of claim 1, wherein the inorganic binder is at least one selected from the group consisting of binders based on $PbO$—$SiO_2$, $PbO$—$SiO_2$—$B_2O_3$, $PbO$—$SiO_2$—$B_2O_3$-$ZnO$, $PbO$—$SiO_2$—$B_2O_3$—$BaO$, $PbO$—$SiO_2$—$ZnO$—$BaO$, $ZnO$—$SiO_2$, $ZnO$—$B_2O_3$—$SiO_2$, $ZnO$—$K_2O$—$B_2O_3$—$SiO_2$—$BaO$, $Bi_2O_3$—$SiO_2$, $Bi_2O_3$—$B_2O_3$—$SiO_2$, $Bi_2O_3$—$B_2O_3$—$SiO_2$—$BaO$ and $Bi_2O_3$—$B_2O_3$—$SiO_2$—$BaO$—$ZnO$.

12. The positive type photosensitive paste composition for a PDP electrode of claim 1, wherein the inorganic binder has a softening temperature from about 400 to about 600° C. and an average particle diameter of from about 0.1 to about 10 μm.

13. The positive type photosensitive paste composition for a PDP electrode of claim 1, wherein an amount of the inorganic binder is from about 0.10 to about 10.0 parts by weight based on 100 parts by weight of the conductive powder.

14. A film prepared using the positive type photosensitive paste composition for a PDP electrode of claim 1.

15. A PDP electrode prepared using the positive type photosensitive paste composition for a PDP electrode of claim 1.

16. A PDP electrode having a trapezoidal shape in which an area of a lower portion which is in contact with a substrate is greater than that of an upper portion which is out of contact with a substrate.

17. A plasma display panel (PDP) comprising one or more PDP electrode prepared using the photosensitive paste composition of claim 1.

* * * * *

UNITED STATES PATENT AND TRADEMARK OFFICE
CERTIFICATE OF CORRECTION

PATENT NO. : 7,442,488 B2  
APPLICATION NO. : 11/239872  
DATED : October 28, 2008  
INVENTOR(S) : Beom-Wook Lee et al.

It is certified that error appears in the above-identified patent and that said Letters Patent is hereby corrected as shown below:

Title Page  
Item (76), Line 5, delete "Yeongtong," for inventor Dong-Hee and replace it with -- Yeongtong-gu, --.

Item (57), Line 7, delete "  " and replace it with --  --.

Specification  
Column 3, Line 11-20 (Approx.) Formula (1), delete "  " and replace it with --  --.

UNITED STATES PATENT AND TRADEMARK OFFICE
CERTIFICATE OF CORRECTION

PATENT NO. : 7,442,488 B2
APPLICATION NO. : 11/239872
DATED : October 28, 2008
INVENTOR(S) : Beom-Wook Lee et al.

It is certified that error appears in the above-identified patent and that said Letters Patent is hereby corrected as shown below:

Column 13, Line 3-10 (Approx.) Formula (1), in claim 1, delete

"  " and replace it with

--  --.

Signed and Sealed this

Nineteenth Day of May, 2009

JOHN DOLL
*Acting Director of the United States Patent and Trademark Office*